United States Patent [19]

Koike et al.

[11] 4,143,286
[45] Mar. 6, 1979

[54] SEMICONDUCTOR MEMORY DEVICE

[75] Inventors: Susumu Koike, Ibaraki; Gota Kano, Nagaoka-Kyo, both of Japan

[73] Assignee: Matsushita Electric Industrial Co., Ltd., Kadoma, Japan

[21] Appl. No.: 803,991

[22] Filed: Jun. 6, 1977

[30] Foreign Application Priority Data

Jun. 16, 1976 [JP] Japan .................................. 51-71508

[51] Int. Cl.² .............................................. G11C 11/40
[52] U.S. Cl. .................................. 307/238; 307/200 B; 307/279; 307/283; 365/159; 365/184; 365/185; 365/228
[58] Field of Search ................ 307/200 B, 238, 279, 307/283, 288, 304; 365/159, 182, 184, 185, 228

[56] References Cited

U.S. PATENT DOCUMENTS

| 3,968,479 | 7/1976 | Goser | 307/238 X |
| 3,975,718 | 8/1976 | Goser | 37/238 X |
| 3,989,962 | 11/1976 | Tagaki et al. | 307/200 B X |
| 4,040,082 | 8/1977 | Goser | 307/304 X |
| 4,053,798 | 10/1977 | Koike et al. | 307/238 |

OTHER PUBLICATIONS

Electronics, 4/18/74; pp. 52–53, "Negative Resistance Shown in Dual FET Device".
Tarui et al., "Electrically Reprogrammable Nonvolatile Seiconductor Memory"; IEEE-JSSC, vol. SC-7, No. 5 (10–1972); pp. 369–375.
Cricchi et al., "The Drain-Source Protected MNOS Memory Device and Endurance"; 1973 Int'l Electron Devices Meeting-Technical Digest; pp. 126–129.
Kaneko et al., "On a Novel Static Memory Using CMOS"; Institute of Electronics & Communication Engrs. of Japan; 1/17/74; pp. 19–28.

Primary Examiner—Larry N. Anagnos
Attorney, Agent, or Firm—Cushman, Darby & Cushman

[57] ABSTRACT

A new type of nonvolatile static read/write memory cell constructed with one MOS transistor and one MNOS transistor (4) is disclosed. The MNOS transistor (4) and the MOS transistor (3) together with a load resistor are complementary combined to offer binary states in the Λ-shaped I-V curve for memory operation under normal power supply. Upon power failure, the MNOS transistor (4) acts as a backing-up element for nonvolatility. By impressing a control pulse on the drain of the MNOS transistor (4) the MNOS transistor changes from the depletion mode to the enhancement mode, thereby storing the last memory contents before the power failure. The stored nonvolatile memory contents can be easily retrieved. Thus a small size static random access memory is provided. The new cell is characterized by advantageous features such as small cell size, simple peripheral circuit, operation with a unipolar power supply and low standby power consumption.

7 Claims, 13 Drawing Figures

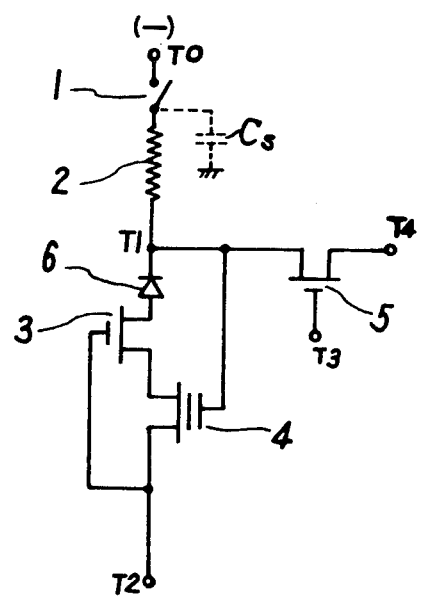
FIG. 1.
FIG. 2(a).
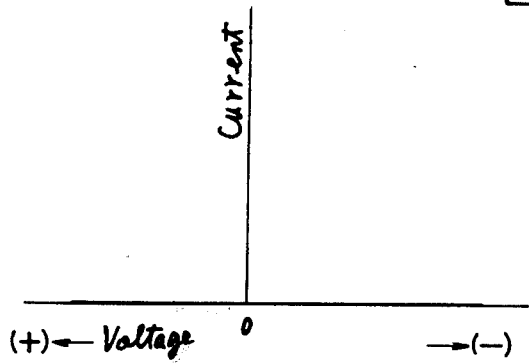
FIG. 2(b).
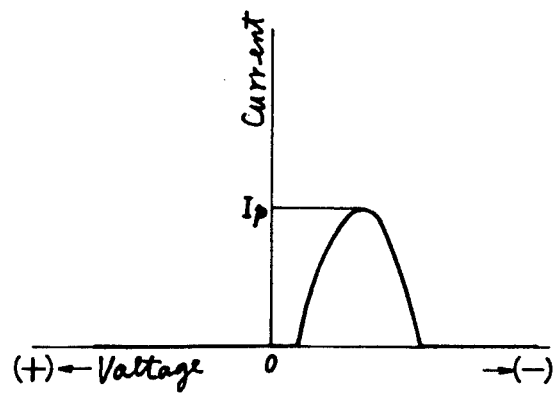

SEMICONDUCTOR MEMORY DEVICE

BACKGROUND OF THE INVENTION

1. Field of the Invention

The present invention relates to a nonvolatile semiconductor device and particularly concerns a nonvolatile bistable memory device comprising a negative resistance device.

2. Description of the Prior Arts

By making use of an electrically bistable circuit device such as a flip-flop device or a negative resistance device, a memory device can be made. Recently, many memory devices are used in the field of information memory.

Most of the conventional memory devices have the shortcoming of instability such as change or maloperation of memorized contents in case of power failure, such as voltage change or voltage cut-off. For example, when the power supply is cut off and restored thereafter, it is not certain which of the bistable states the devices were in, and it is not assured that a state of memory before the power cut off is restored. Therefore, in such memory device, in the view point of reliable memorization of the information, we must understand that the memorized information has been erased upon the power failure.

SUMMARY OF THE INVENTION

The object of the present invention is to provide a semiconductor memory device which comprises a negative resistance device and, after restoration from a power failure, enables restoration of the state of memory before the power source was cut off.

Another object of the present invention is to provide a static random access memory device which consists mainly of a unit cell of comparably simple circuit construction and reliably operates.

The intended function of the memory device of the present invention is that the device makes a bistable operation by means of input signals across its two terminals, and furthermore that when a power supply to the terminals is cut off, by means of impressing a specified control signal a state corresponding to that before the power failure is stored in the device, thereby enabling to restore the exact memorized state before the power failure.

According to the present invention, since the memorized state when the power failure occurs is automatically stored in the device, the memorized state can be restored easily and exactly.

BRIEF EXPLANATION OF THE DRAWING

FIG. 1 is an equivalent circuit diagram of one example of the memory device embodying the present invention.

FIGS. 2 to 4 are graph elucidating the operation of the example of FIG. 1.

DETAILED DESCRIPTION OF THE INVENTION

Figure 3:
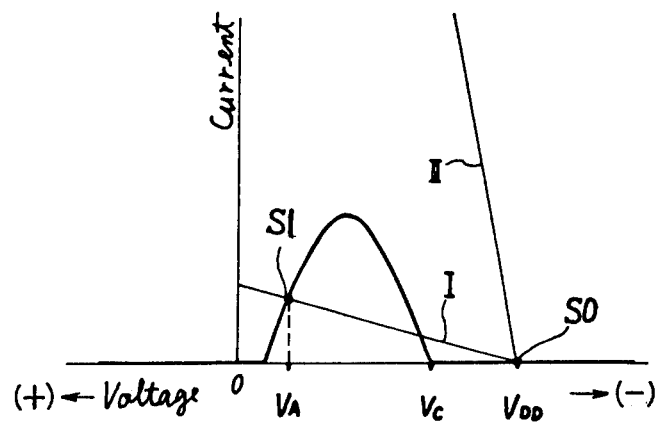

The semiconductor memory device of the present invention is explained hereinafter referring to the accompanying drawings showing preferred examples of the present invention.

FIG. 1 shows an equivalent circuit of a fundamental example embodying the present invention. As shown in FIG. 1, the memory device of the example comprises, across the negative voltage feeding terminal T0 and another terminal T2, a series connection of an on-off switch 1, a load resistor 2, a diode 6, a depletion-mode p-channel insulated gate type FET 3 and an n-channel insulated gate type FET 4 having gate electrode construction of double layered films, such as MNOS type. The source electrodes of MOS FET 3 and the MNOS FET 4 are connected to each other. The gate electrode of the MOS FET 3 is connected to the drain electrode of the MNOS FET 4 and the gate electrode of the MNOS FET 4 is connected to the drain electrodes of the MOS FET 3 through the diode 6. An enhancement mode FET 5 as a switching or gating device is connected between the node T1 and a read-out terminal T4. A terminal T3 is connected to the gate electrode of the FET 5. The MNOS FET 4 has MNOS construction wherein the gate electrode has the combination of metal electrode — silicon nitride film — very thin (usually 10 to 50 Å) silicon oxide film — silicon substrate. The MNOS FET changes to depletion-mode when positive electric charges are injected in the double layered insulation films by an impression of a specified negative voltage on the gate metal electrode. When the MNOS FET 4 is in the depletion-mode, the MOS FET 3 and the MNOS FET 4 form a complementary combination and positive feed-back type series connection, have a Λ (Greek letter lambda) type voltage-current characteristic curve and show a negative resistance characteristic.

PRINCIPLE OF FIG. 1 CIRCUIT:

(A) In the initial state:

Since the MNOS FET 4 is in the enhancement-mode, when a negative voltage $V_{DD}$ is impressed on the terminal T0 by closing the on-off switch 1, no current flows into the circuit.

On the contrary, when a positive voltage is impressed on the terminal T0, due to the backward high resistance of the diode 6, no current flows into the circuit.

Namely, in the initial state, the voltage-current characteristic curve between the nodes T1 and T2 is as shown in FIG. 2(a), wherein no current flows.

(B) Write-in:

When a negative voltage $V_W$ with respect to the terminal T2 of $|V_W| > |V_{Wt}|$, for a specified critical value $V_{Wt}$, is impressed on the terminal T1, the negative voltage $V_W$ is impressed on the gate electrode of the MNOS FET 4. Therefore, positive electric charges are injected in the double layered insulation films under the gate electrode. This phenomenon also considers that electrons hitherto trapped in the double layered insulation films are discharged into the underlying semiconductor substrate by means of a tunnel effect hence forming positive holes in the insulation films. Then the injected electric charge remains even after removal of the negative voltage $V_W$, and therefore, makes the threshold voltage (of the gate electrode) for forming conductive channel change thereby changing the MNOS FET 4 to depletion-mode.

Thus, both FETs 3 and 4 form a complementary combination having a positive feed back operation, and therefore, a Λ (lambda)-shaped voltage-current characteristic which has a negative resistance characteristic as shown in FIG. 2(b) is observed across the nodes T1 and T2. Such negative resistance characteristic can be used for writing-in, namely memorization of information.

In the characteristic curve of FIG. 2(b), the values of peak current $I_p$ and the cut-off voltage $V_C$ change depending on the impressed voltage $V_W$. As $|V_W|$ is large, their absolute values are large. However, if $|V_W|$ is smaller than $|V_{Wt}|$, then the abovementioned charge injection does not take place and accordingly, no negative resistance characteristic appears.

(C) Erasing:

When a negative voltage $V_W$ with respect to the terminal T1 of $|V_W| > |V_{Wt}|$ is impressed on the terminal T2, the voltage is impressed also to the double layered insulation films under the gate electrode. The impressed voltage is of the inverse polarity to that of the abovementioned case (B), and therefore, negative electric charges, namely electrons are injected into the double layered insulation films. As a result of this injection, the positive charges which have been injected in the previous process of B) disappear by recombination with the injected electrons, thereby returning the MNOS FET 4 to the enhancement mode. Accordingly, the negative resistance characteristic disappears. Such losing of the negative resistance characteristic can be used for erasing of information.

ACTUAL OPERATION OF FIG. 1 CIRCUIT

(D) Giving a negative resistance characteristic:

In the circuit of FIG. 1, the negative voltage $V_W$ with respect to the terminal T2 of $|V_W| > |V_{Wt}|$ for writing described in the foregoing paragraph B) is impressed on the terminal T1 through the input terminal T4 while impressing a driving signal on the gate electrode of the switching FET 3 through the terminal T3. Then, by means of the abovementioned impression of the voltage $V_W$, the MNOS FET 4 turns to the depletion-mode, thereby writing the negative resistance characteristic of FIG. 2(b) between the node T1 and T2, and the device turns into a nonvolatile memory device.

(E) Writing-in of "1":

Since the device between the nodes T1 and T2 has a negative resistance characteristic of FIG. 2(b), by closing the switch 1 and thereby impressing a negative voltage $V_{DD}$ on the terminal T0, which voltage is to be impressed on the terminal T1 through a suitable load resistance 2, the operating point comes to a stable point S1 at a voltage $V_A$ of FIG. 3, which is a cross point of the positive resistance part of the Λ shaped characteristic curve of the complementary combination of the MOS FET 3 and the MNOS FET 4 and a load curve I of the load resistance 2. Therefore, the voltage $V_S$ of the node T1 is $V_A$ of FIG. 3. The stable point S1 is used, for instance, as a first memory state.

The abovementioned source voltage $V_{DD}$ is selected in the relation of $$|V_C| < |V_{DD}| \leq |V_W|.$$

(F) Writing in of "0":

While retaining the abovementioned $V_{DD}$ at the terminal T0, by impressing the same negative voltage $V_{DD}$ through the terminal T4 on the node T1 as that impressed on the terminal T0 at least for a specified time period, the circuit operation becomes equivalent to the case where the load resistance 2 is shortcircuited. Therefore the load curve becomes almost vertical as shown by curve II, though it is not exactly vertical since there are some small resistance in wiring lines, etc. Since this vertical line does not cross the Λ shape curve, the voltage $V_S$ of the node T1 comes to another stable point S0 where voltage is $V_{DD}$ and current is zero. The stable point S0 is used, for instance, as a second memory state.

Namely, by defining, for instance, that the state of $V_S = V_A$ (i.e., operation point S1) is "1", and $V_S = V_{DD}$ (i.e., operation point S0) is "0". a static random access memory is made.

(G) Actual writing of "0" and "1":

The switch 1 is closed to connect the terminal T0 to the negative terminal of the power source of the voltage $V_{DD}$ to obtain the Λ characteristic between the nodes T1 and T2.

Then, the state of memory of "0" is obtained by impressing the same negative voltage $V_{DD}$ on the terminal T4 and impress a gating pulse signal on the terminal T3 for at least a specified short time period thereby making the switching FET 5 on. Then, the potential of the node T1 becomes $V_{DD}$ and the state of "0" is memorized.

On the other hand, the state of memory of "1" is obtained by impressing same negative voltage same as that of the node T2 on the terminal T4 and impressing a gating pulse signal on the terminal T3 at least for a specified short time period thereby making the switching FET 5 on. Then, the potential of the node T1 becomes once zero and immediately thereafter becomes $V_A$ and the state of "1" is memorized.

(H) Reading out:

The reading out of the abovementioned memorized "0" and "1" state is made by:

while retaining the impression of the negative voltage $V_{DD}$ on the terminal T0, impressing a signal on the terminal T3 thereby making the switching FET 5 on and measuring the voltage $V_S$ of the node T1 through the terminal T4.

As is elucidated in the abovementioned example, in the static random access memory device of the present invention, for the input writing-in signal to the terminal T4, the negative voltage $V_{DD}$ to be impressed on the terminal T0 and a ground voltage (zero volt) identical to that of the node T2 only are used for writing 1 and "0", respectively. Accordingly, a simple power source suffices. Furthermore, the construction of the device is simple because the terminal T4 is also used as the reading out terminal.

(I) Backing-up:

Backing-up of the memory against a power cut-off is attained as follows:

Upon cut-off of the negative voltage $V_W$ fed from the terminal T0, a negative voltage $V_W'$ of $$|V_{Wt}| < |V_{W'}| < |V_{Wt} + V_{DD}|$$

is impressed on the terminal T2. Then, the transient voltage change across the terminals T0 and T2 is subject to the influence of the stray capacities in the devices or capacitance $C_S$ of an additional capacitor connected in parallel with the two terminals T0 and T2, the capacitor being connected if necessary. Thus, the voltage across the nodes T1 and T2 changes from the initial condition of $|V_W - V_S|$. I-1). When the memory was "1" at the time of cut-off of the power supply, by means of the abovementioned impression of the negative voltage $V_{W'}$, the voltage $V_S$ of the node T1 with respect to the ground voltage is $$V_S = V_A \text{ and } |V_A| << |V_{DD}|.$$

Accordingly, the voltage difference between the nodes T1 and T2 at the time of the impression of the negative voltage $V_{W'}$ on the terminal T2 is $$|V_{W'} - V_S| \approx |V_{W'}| > |V_{Wt}|.$$

Resultantly, the erasing elucidated in the foregoing paragraph (C) takes place and the Λ-shaped characteristic disappears turning the device to the state of FIG. 2(a).

Figure 4A:
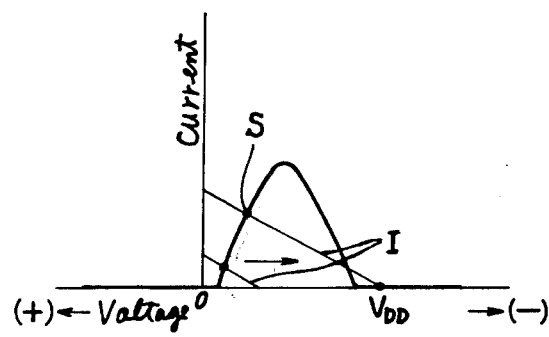
Figure 4B:
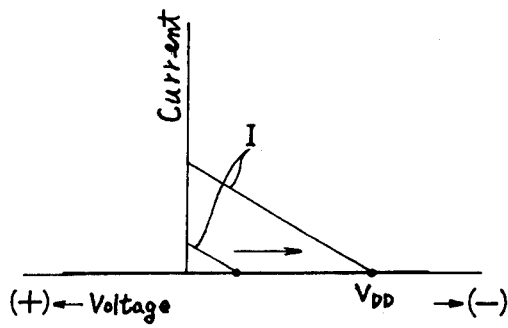

Since the device is now in the state of FIG. 2(a) (namely, non-negative resistance), when the power failure is removed and the voltage at the terminal T0 rises from zero to $V_{DD}$, the load line I shifts rightward as indicated by an arrow in FIG. 4(b). Hence the voltage $V_S$ of the node T1, measured at the terminal T4 through the switching FET 5 rises from zero to the negative voltage $V_{DD}$. Therefore, the measured voltage $V_S$ reaches $V_S = V_B (= V_{DD})$.

Immediately thereafter, since the source voltage $V_{DD}$ is selected to be $$|V_{DD}| > |V_{Wt}|,$$

the Λ-shaped characteristic returns to the device. However, the abovementioned state of $V_S = V_B (= V_{DD})$ still remains, and therefore, the operating point then remains at the point S0 which indicates "0" and is the opposite to the memory of "0" before the occurrence of the power cut-off. (I-2) When the memory was "0" at the time of cut-off of the power supply, the operation point is S0 in FIG. 3. Then, at the time immediately before the cut-off, the voltage $V_S$ of the node T1 with respect to the ground is almost $V_S \approx V_{DD}$. Therefore, when the negative voltage $V_{W'}$ of $$|V_{Wt}| < |V_{W'}| < |V_{Wt} + V_{DD}|$$

is impressed on the terminal T2 upon the cut-off of the switch 1, the possible largest voltage difference $|V_{W'} - V_S|$ between the node T1 and T2 is given by $$|V_{W'} - V_S| \approx |V_{W'} - V_{DD}| < |V_{Wt}|.$$

Namely, the voltage across the nodes T1 and T2 is less than the critical value $V_{Wt}$, and accordingly, the Λ-shaped characteristic can not be erased. Namely, the Λ-shaped characteristic of FIG. 2(b) is retained. Accordingly, when the negative voltage $V_{DD}$ with respect to the ground is again impressed on the terminal T0, the voltage across the nodes T1 and T2 rises up from zero toward the negative voltage $V_{DD}$ according to know transient phenomenon. Thus, the load line I shifts rightward as indicated by an arrow in FIG. 4(a). Hence, the operation point shifts from the origin 0 along the Λ-shaped curve and reaches the stable point S1, thereby bringing the voltage $V_S$ of the node T1 to $V_A$. The resultant stable point of $V_S = V_A$ is stored and indicates "1" which is opposite to the memory of "0" before the occurrence of the cut-off of the power. (I-3) Retrieving the stored information (i.e., the memory before the cut-off):

As elucidated in the foregoing two subparagraphs I-2 and I-3), the "1" and "0" states of the memory which existed at the time of the power failure are stored and retained in the opposite information, respectively, after the cut-off, by impressing the negative voltage $V_{W'}$ on the terminal T2. The retention of the information is nonvolatile until a next recovery of the power supply to the terminal T0.

In order to retrieve the same memories with those which have been memorized before the power cut-off, the aforementioned processes of impressing the negative voltage on the terminal T2 described in the foregoing subparagraphs I-1) and I-2) are carried out. Then the stored memories "0" and "1" are inversed to "1" and "0" which are identical to those which existed at the time of the power failure.

Figure 5A:
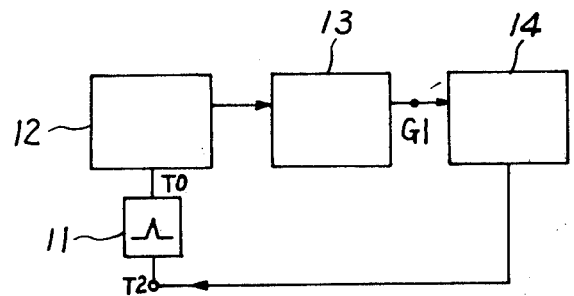
FIGS. 5(a) and 5(b) are a block diagram and a circuit diagram, respectively, of an operating circuit for the device of the present invention.
Figure 5B:
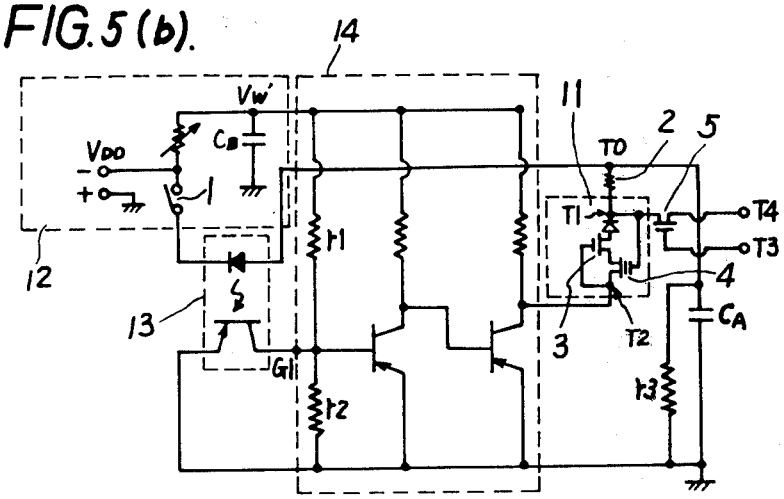

FIG. 5(a) and 5(b) show one example of the operating circuit for the device of the static random access memory of the present invention. In the block diagram of FIG. 5(a), the output terminal of a switching circuit 14 is connected to the terminal T2 of the negative resistance device 11, and the output terminal of the power source 12 is connected to the terminal T0 of the negative resistance device 11. The voltage failure detecting circuit 13 detects a voltage cut-off of the power source 12 and sends its output from its output terminal to the input terminal G1 of the switching circuit 14.

FIG. 5(b) is a more detailed circuit diagram of the apparatus shown in FIG. 5(a). The voltage failure detecting circuit 13 can be formed by, for example, a photo-coupler as shown in FIG. 5(b), and the capacitors $C_A$ and $C_B$ are for retaining the voltage of $V_{DD}$ at the terminal T0 and the voltage $V_{W'}$ at the terminal T2 for specified times, respectively.

Figure 6:
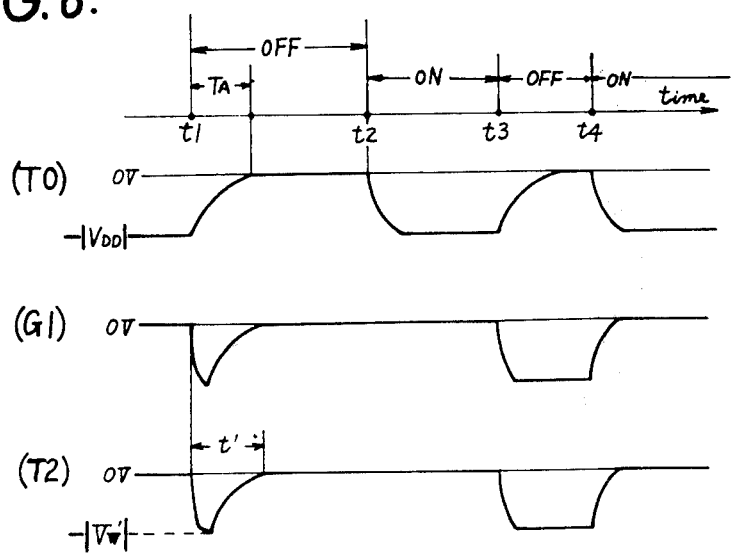
FIG. 6 is a time chart elucidating the operation of the circuit of FIG. 5.

The operation time chart of FIG. 5(b) is shown in FIG. 6. The operation is elucidated as follows:

Provided that the negative power source voltage fed from the terminal $V_{DD}$ of the power source 12 is cut-off at the time of T1, the voltage of the terminal T0 quickly decays as shown by a curve T0 of FIG. 6 from $-V_{DD}$ to zero within a time $T_A$ which is dependent on the stray capacity or a wilfully connected capacity $C_A$ across the terminals T0 and T2. Accordingly, by picking up such voltage decay by the voltage failure detecting circuit 13 consisting of a photo-coupler, a sharp-rising detection signal as shown by the waveform curve G1 of FIG. 6 is obtainable at the input terminal G1 of the switching circuit 14. Since the photocoupler 13 has a quick response characteristic, the rising up (to the negative direction) of the curve G1 is made sufficiently within the abovementioned time $T_A$. Therefore a sharp pulsive signal as the component voltage of a decaying voltage which is proportional to the decaying curve of T0 of FIG. 6 and the rising up curve is obtainable at the terminal G1. Accordingly, the output terminal, hence, the terminal T2 of the negative resistance device 11 receives a negative voltage pulse of voltage $V_{W'}$ as in the curve (T2) of FIG. 6. Pulse width t' of the negative voltage pulse curve T2 of FIG. 6 which is dependent on pulse width $T_4$ of the curve T2 can be attained by selecting the capacity of the capacitor $C_B$ in the power source 12. Thus, by impression of the negative high voltage $V_W'$ on the terminal T2, the abovementioned nonvolatile writing in is obtainable.

Now, by selecting the negative power source voltage $V_{DD}$ and the output negative voltage $V_W'$ of the switching circuit 14 to the terminal T2 to be equal to the writing-in voltage $V_W$ to the terminal T4, namely:

$$|V_{DD}| = |V_W'| = |V_W|,$$

when the power source voltage is restored at the time T2, the negative resistance device 11 receives a voltage rising up from zero to $V_{DD} = V_W$. As a result of this rising up of the voltage impressed, in the negative resistance device 11 the operation point lies on a different point from that before the power voltage cut-off occurs. Therefore, in order to restore the memory which existed before the power cut-off, another power cut-off of the negative voltage $V_{DD}$ is to be made by means of opening the switch 1. In FIG. 6, such intentional cut-off is made at the time T3 and the switch 1 is again closed at the time T4. By means of the cut-off at T3 and closing at T4, the memory in the device 11 is inversed to restore the original memory state before the power cut-off at the time T1. Therefore, usual operation of static random access memory can be continued thereafter.

Figure 7A:
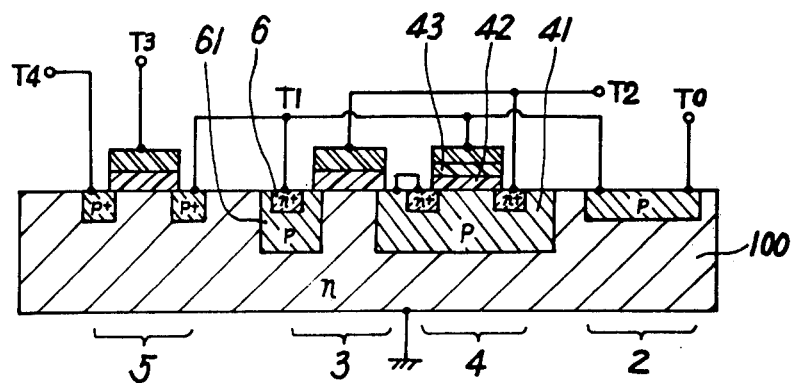
FIG. 7(a) is a sectional elevation view of the device of FIG. 1.

FIG. 7(a) shows a schematic cross-sectional view of the cell structure embodying the present invention. The auxiliary diode 6 is inserted in the drain contact region 61 of the p-channel depletion MOS transistor so as to reduce the area as small as possible.

Fabrication technology used is similar to that of the conventional C-MOS device except an additional process for double insulator gate formation. The starting substrate 100 is n-type (100)-oriented silicon with a resistivity of 10 Ω-cm. The p-well regions 2 and 61 and the p-depletion MOS transistor region 41 were formed by using the boron-implantation technology with doses of $2.5 \times 10^{12}$ and $5 \times 10^{12}$ ions/cm$^3$ at 50 KeV, respectively. The surface impurity concentration and the diffusion depth were $1 \times 10^{16}$ cm$^{-3}$ and 4 μm, respectively. The double insulator gate was made of a 20 Å thick SiO$_2$ layer 42 thermally grown at 600°–900° C. in dry O$_2$ and a 500–650 Å thick Si$_3$N$_4$ layer 43 overdeposited by the reaction of SiH$_4$ and NH$_3$ at 600°–800° C. The cell size was designed to be 80 μm × 135 μm.

Figure 7B:
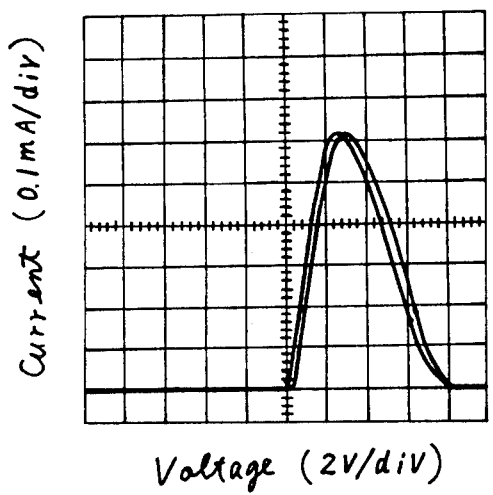
FIG. 7(b) is a graph of current-voltage characteristic curve of the example of FIG. 7(a).

The samples thus fabricated were subjected to an initial forming pulse of $-30$ V/1 sec in order to obtain the Λ-shaped I-V characteristics. A typical I-V curve observed is shown in FIG. 7(b).

Figure 8:
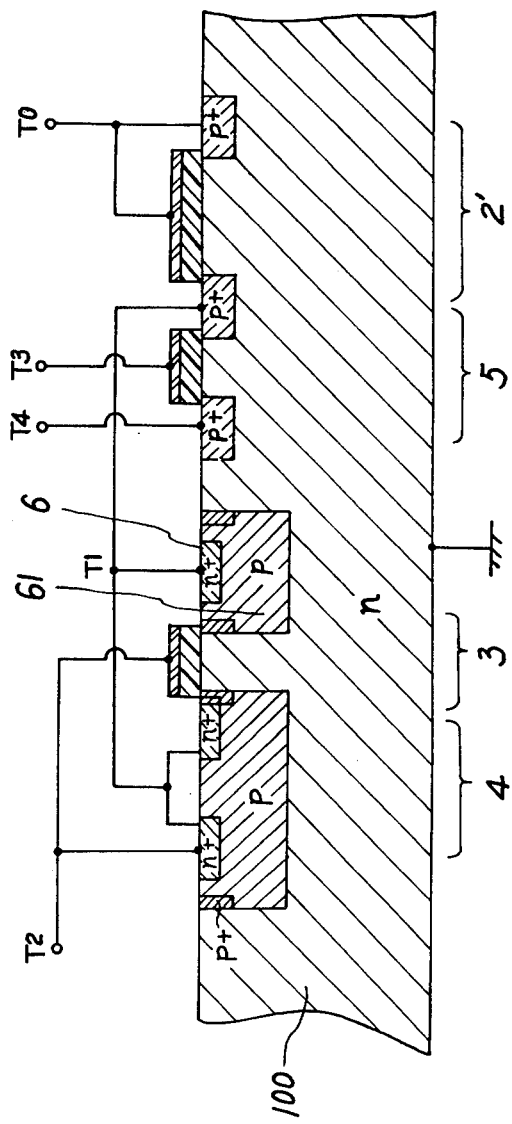
FIG. 8 is a sectional elevation view of another example of memory device embodying the present invention.
Figure 9:
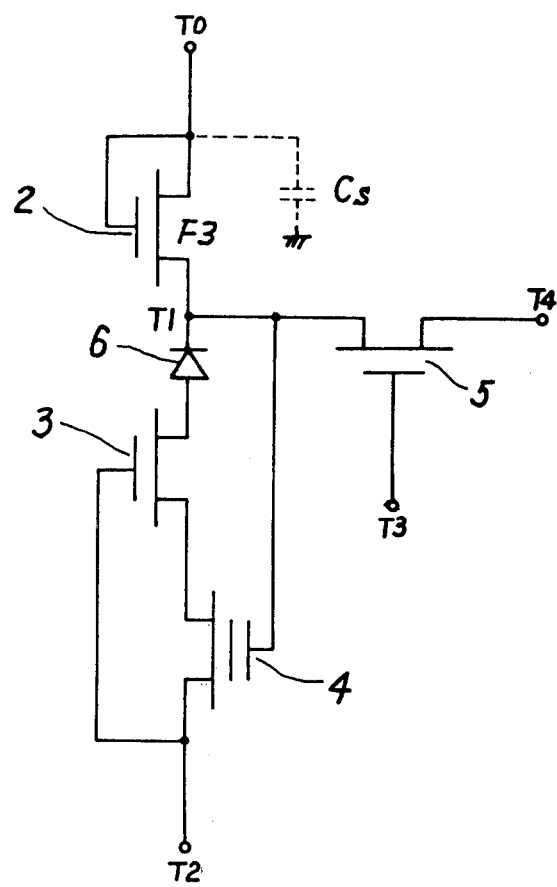
FIG. 9 is an equivalent circuit diagram of the device of FIG. 8.

FIG. 8 shows a sectional side view of a memory device of the present invention, wherein, in the equivalent circuit diagram of FIG. 1, the load resistor 2 is replaced by a p-channel MOS FET 2', for making use of the resistance of the p-channel region as the resistor 2. The equivalent circuit of the memory device of the construction of FIG. 8 is shown in FIG. 9. The operation characteristics of the memory device of FIGS. 8 and 9 are substantially the same with those of FIG. 1 and FIG. 7.

Another example can be made by replacing the MNOS FET 4, which stores the information of the power failure, by a suitable memory device with substantially the same characteristics. For such memory device, the following types of the memory devices of Metal-Insulator-Semiconductor (MIS) construction can be used.

(1) MAOS FET having a gate construction of metal electrode (M) — aluminum oxide film (Al$_2$O$_3$, etc.) (A) — silicon oxide film (SiO$_2$, etc.) (O) — semiconductor (S).

(2) MAS FET having a gate construction of metal electrode (M) — aluminum oxide film (Al$_2$O$_3$ etc.) (A) — semiconductor (S).

(3) Floating gate FET having an electric conductor electrode (such as low resistance polycrystalline silicon) buried in as if floating in a gate insulation film.

(4) AMOS FET (avalanche MOS FET) having a trap level in a gate insulation film, thereby attaining a function similar to that of the abovementioned buried gate of the floating gate FET by means of capturing by the trap level of electric charges (mainly of electrons) injected by an avalanche injection.

The nonvolatile operation of the cell strongly depends on the value of the resistance 2 or the equivalent resistance of the load transistor F$_3$ of FIG. 9. No distinguishable difference in the I-V characteristics was found between both states of "0" and "1" if stored through such a low load resistance as 100 KΩ. Empirical data suggests that the load resistance value of 20 MΩ, which covers the equivalent resistance range of the conventionally fabricated p-channel transistor F$_3$ as the load, is sufficiently high for the successful storage operation.

The present cell requires merely two or three MOS transistors, one MNOS transistor and four external lines, simplifying the cell geometry and the peripheral circuitry. In addition, in the present cell all modes can be operated with a unipolar power supply, while the previous cell requires a bipolar power supply to the gate for the nonvolatile operations.

Standby power consumption of the cell of one example is 35 μm, which is much lower than 0.3–0.5 mW of the previous cell. This reduction of the power consumption is due to the fact that in the present cell the current at the "1" state is practically cut-off with a value below $10^{-9}$ A. The writing speed of the example of the present cell, which is mainly determined by the channel conduction of the switching transistor 5 and the value of the stray capacitance $C_S$, was observed as 500 ns. This suggests that no disadvantage will be found in the access time of a fully decoded integrated memory device of the present cells in comparison with the conventional static read/write memory devices constructed with six MOS transistor cells. It should be noted that an increase of the resistance value of the load resistance 2 or F$_3$ for lowering the standby power consumption and ensuring the storage operation does not slow the access time. The standby power consumption could be expected to be of the same order of magnitude as that of the C-MOS static read/write memory cell.

What we claim is:

1. A semiconductor memory device including on a monolithic substrate
   a negative resistance device which comprises a series connected complementary pair of field-effect transistors of opposite conductivity types to each other, both to operate in depletion mode, at least one of said field effect transistors being an insulated gate type field effect transistor having at least one insulation film under a gate electrode which insulation film stores electric charges therein thereby making said insulated gate type field-effect transistor in depletion mode thereby giving said negative resistance device a nonvolatile memory function, each of said field-effect transistors including source, gate and drain regions and in said series connected complementary pair both field-effect transistors being connected with each other by the source region of a first field-effect transistor connected to the source region of a second field-effect transistor, by the drain region of said first field-effect transistor connected to a first terminal, by the drain region of said second field-effect transistor connected to a second terminal, by the gate region of said second field-effect transistor connected to said first terminal and by the gate region of said first field-effect transistor connected to said second terminal, characterized in that said first terminal is connected through a built-in load resistor to a third terminal and a gating means for operating writing-in and reading out of the contents of the memory is connected to said first terminal.

2. A semiconductor memory device of claim 1, wherein said negative resistance device including a diode between said first terminal and the drain region of said first field-effect transistor.

3. A semiconductor memory device of claim 1, wherein said field-effect transistor having metal-insulator-semiconductor construction selected from the below-mentioned group consisting of (1) MNOS FET having a gate construction of metal electrode (M) — silicon nitride film (N) — silicon oxide film (O) — semiconductor (S), (2) MAOS FET having a gate construction of metal electrode (M) — aluminum oxide film (A) — silicon oxide film (O) — semiconductor (S), (3) MAS FET having a gate construction of metal electrode (M) — aluminum oxide film (A) — semiconductor (S), (4) Floating gate FET having a electric conductor electrode burried in as if floating in a gate insulation film and (5) AMOS FET (avalanche MOS FET) having a trap level in a gate insulation film for capturing electric charges injected by an avalanche injection.

4. A semiconductor memory device of claim 1, wherein said load resistor is formed by a source-drain resistance of an insulated gate type field-effect transistor.

5. A semiconductor memory device of claim 1, wherein said gating means is an insulated gate type field-effect transistor.

6. A semiconductor memory device including on a monolithic substrate a negative resistance device which comprises a series connected complementary pair of field-effect transistors of opposite conductivity types to each other, both to operate in depletion mode, at least one of said field-effect transistors being an insulated gate type field-effect transistor having at least one insulation film under a gate electrode which insulation film stores electric charges therein thereby making said insulated gate type field-effect transistor in depletion mode thereby giving said negative resistance device a nonvolatile memory function, each of said field-effect transistors including source, gate and drain regions and in said series connected complementary pair both field-effect transistors being connected with each other by the source region of a first field-effect transistor connected to the source region of a second field-effect transistor, by the drain region of said first field-effect transistor connected to a first terminal, by the drain region of said second field-effect transistor connected to a second terminal, by the gate region of said second field-effect transistor connected to said first terminal and by the gate region of said first field-effect transistor connected to said second terminal, characterized in that said first terminal is connected through a load resistor to a third terminal, across which terminal and said second terminal a specified voltage to give the negative resistance device a stable operation point and another specified voltage which in case of cut-off of said specified voltage makes the negative resistance device to store the state of the memory at the time of said cut-off, are to be impressed and a gating means for operating writing-in and reading out of the contents of the memory is connected to said first terminal.

7. A memory apparatus including a negative resistance device (11) which comprises a series connected complementary pair of field-effect transistors of opposite conductivity type to each other, both to operate in depletion mode, at least one (4) of said field-effect transistors being an insulated gate type field-effect transistor having at least one insulation film under a gate electrode which insulation film stores electric charges therein thereby making said insulated gate type field-effect transistor in depletion mode thereby giving said negative resistance device (11) a nonvolatile memory function, each of said field-effect transistor including source, gate and drain regions and in said series connected complementary pair both field-effect transistors being connected with each other by the source region of a first field-effect transistor connected to the source region of a second field-effect transistor, by the drain region of said first field-effect transistor (3) connected to a first terminal (T1), by the drain region of said second field-effect transistor (4) connected to a second terminal (T2), by the gate region of said second field-effect transistor (4) connected to said first terminal (T1) and by the gate region of said first field-effect transistor (3) connected to said second terminal (T2), a load resistor (2) connected between said first terminal (T1) and a third terminal (T0), a first voltage source (12) for impressing on said second terminal a first voltage to give the negative resistance device two stable operation points, a second voltage source (14) for impressing on said second terminal (T2) a second voltage which makes the negative resistance device (11) to store the state of the memory at the time of a cut-off of said first voltage and a voltage cut-off detector (13) which detects a cut-off of said first voltage and immediately actuates said second voltage source (14) to make said storing of the state of the memory of the negative resistance device (11).

* * * * *